United States Patent [19]

Lim

[11] Patent Number: 5,291,443
[45] Date of Patent: Mar. 1, 1994

[54] SIMULTANEOUS READ AND REFRESH OF DIFFERENT ROWS IN A DRAM

[75] Inventor: Hank H. Lim, Mountain View, Calif.

[73] Assignee: Micron Technology, Inc., Boise, Id.

[21] Appl. No.: 721,825

[22] Filed: Jun. 26, 1991

[51] Int. Cl.$^5$ ............................................... G11C 7/00
[52] U.S. Cl. ................................ 365/189.04; 365/222; 365/230.04
[58] Field of Search ....................... 365/189.01, 189.04, 365/222, 230.04

[56] References Cited

U.S. PATENT DOCUMENTS

| | | | |
|---|---|---|---|
| 3,846,765 | 11/1974 | De Vries | 365/222 |
| 4,106,108 | 8/1978 | Cislaghi et al. | 365/222 |
| 4,581,720 | 4/1986 | Takemae et al. | 365/222 |
| 4,847,809 | 7/1989 | Suzuki | 365/230.04 X |

Primary Examiner—Seungsook Ham
Attorney, Agent, or Firm—Michael W. Starkweather

[57] ABSTRACT

A memory array configuration of memory cells that allows simultaneous read and refresh of the memory cells includes M rows and N columns of memory cells, each row being arranged into a top half-row of N/2 memory cells corresponding to each odd-numbered column and a bottom half-row of N/2 memory cells corresponding to each even-numbered column. Each memory cell in the top half-row has a write column node coupled to a respective write column line, a read column node coupled to a respective read column line, a write row node coupled to a respective first write row line, and a read row node coupled to a respective read row line. Each memory cell in the bottom half-row has a write column node coupled to a respective write column line, a read column node coupled to a respective read column line, a write row node coupled to a respective second write row line, and a read row node coupled to a respective read row line. A row of N/2 charge sensing amplifiers each has a first input coupled to an odd-numbered write column line and a second input coupled to a next even-numbered write column. A row of N current/voltage sensing amplifiers each has an input coupled to one of the read column lines and an output for providing a digital signal.

12 Claims, 4 Drawing Sheets

SIMULTANEOUS READ AND REFRESH OF DIFFERENT ROWS IN A DRAM

BACKGROUND OF THE INVENTION

This invention relates generally to a memory array configuration and more particularly to a memory array configuration that allows simultaneous read and refresh of the memory cells in the array.

In a dynamic random access memory ("DRAM"), data is stored as a logic one or zero by the presence or absence of charge on a capacitor within an individual memory cell. After the data has been stored as charge on the capacitor, the charge gradually leaks off and the data is corrupted. Therefore, a "refresh" cycle must be performed to maintain the integrity of the data. To refresh data in a memory array, the array is typically placed in a read mode to obtain the present data stored in a row of memory cells. Subsequently, this data is used as new input data that is re-written into the row of memory cells, thus maintaining the stored data. An important aspect of the refresh cycle of prior art DRAMs is that a normal read operation must be performed on the row that is being refreshed. No other operation involving a different row in the array can occur simultaneously during the read operation.

A functional block diagram of a typical DRAM, the MT4C4003 1 megabit×4 DRAM manufactured by Micron Technology, Inc. of Boise, Id., is shown in FIG. 1. The DRAM memory contains approximately 4 megabits organized into four 1 megabit memory arrays 10A–10D. Circuit block 50 includes sense amplifiers coupled to each column within the memory array to transform charge on the capacitor in the memory cell into a valid logic one or zero. During read and write cycles, each bit in one of the four memory arrays is uniquely addressed through twenty address bits that are entered ten bits (A0–A9) at a time. The RAS signal (row address strobe) latches the first ten bits and the CAS signal (column address strobe) latches the latter ten bits. A read or write cycle is initiated with the WE signal (write enable). The four data inputs/outputs (DQ1–DQ4) are routed through four pins using a common input/output bus controlled by the WE signal and an OE signal (output enable).

In the DRAM of FIG. 1, three types of refresh cycles are available. Two of the cycles involve a specific address provided by the user, along with appropriate RAS and/or CAS signals. A third, "hidden" refresh cycle automatically and internally refreshes the data sequentially in the memory arrays. The hidden refresh cycle is initiated by an appropriate combination of the RAS and CAS signals without specifying an address. However, none of the three refresh cycles allows the user of the DRAM to accomplish any other functions involving different rows within the array while the combination read/refresh cycles are being performed.

Accordingly, a need remains for a memory array configuration that allows a simultaneous read cycle of the memory cells in one row of the memory array and a refresh cycle of the memory cells in another row of the memory array to decrease access time to the stored data.

SUMMARY OF THE INVENTION

It is, therefore, an object of the invention to improve access time to stored data within a memory array.

Another object of the invention is to provide a memory array configuration capable of a read operation on one row of the array while performing a simultaneous refresh operation on a different row within the array.

According to the present invention, a memory array configuration of memory cells that allows simultaneous read and refresh of the memory cells includes M rows and N columns of memory cells arranged in a folded architecture. Each row is arranged into a top half-row of N/2 memory cells corresponding to each odd-numbered column and a bottom half-row of N/2 memory cells corresponding to each even-numbered column. Each memory cell in the top half-row has a write column node coupled to a respective write column line, a read column node coupled to a respective read column line, a write row node coupled to a respective first write row line, and a read row node coupled to a respective read row line. Each memory cell in the bottom half-row has a write column node coupled to a respective write column line, a read column node coupled to a respective read column line, a write row node coupled to a respective second write row line, and a read row node coupled to a respective read row line. A row of N/2 charge sensing amplifiers each has a first input coupled to an odd-numbered write column line and a second input coupled to a next even-numbered write column. A row of N current/voltage sensing amplifiers each has an input coupled to one of the read column lines and an output for providing a digital signal.

In operation, one of the entire rows of memory cells is read-selected, which transfers charge in the memory cells to the respective read column node and read column line. The current/voltage sensing amplifiers respectively coupled to the read column node of each of the memory cells transforms the charge into a valid logic signal to complete a normal read operation. Simultaneously during the read operation, each of the write column lines is normalized to a reference level that is halfway between the logic one and zero charge levels. A second half-row of memory cells is write-selected, which transfers charge in the memory cells to the respective write column node and write column line. In the present memory array configuration, a pair of write column lines contains a charge from the memory cell, and the other write column line in the pair retains the reference level. Therefore, the charge amplifiers force complementary valid logic levels on each successive pair of write column lines responsive to the charge difference in the write column lines to simultaneously refresh the second half-row while the first half-row is being read. The first and second half-rows are entirely separate and need not be adjacent in the array.

The foregoing and other objects, features and advantages of the invention are more readily apparent from the following detailed description of a preferred embodiment of the invention that proceeds with reference to the accompanying drawings.

DETAILED DESCRIPTION

Figure 1:
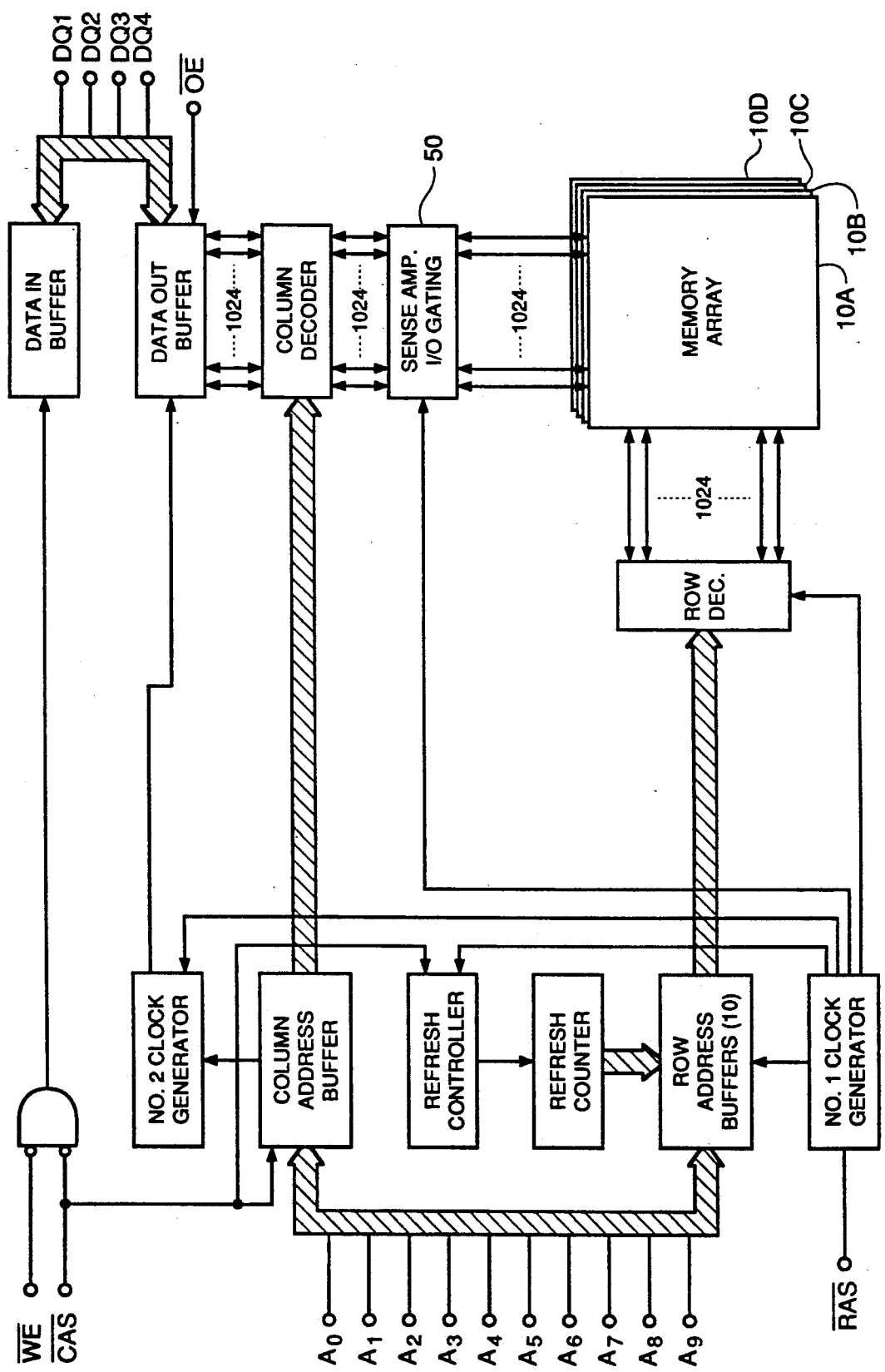
FIG. 1 is a functional block diagram of a typical DRAM.
Figure 2:
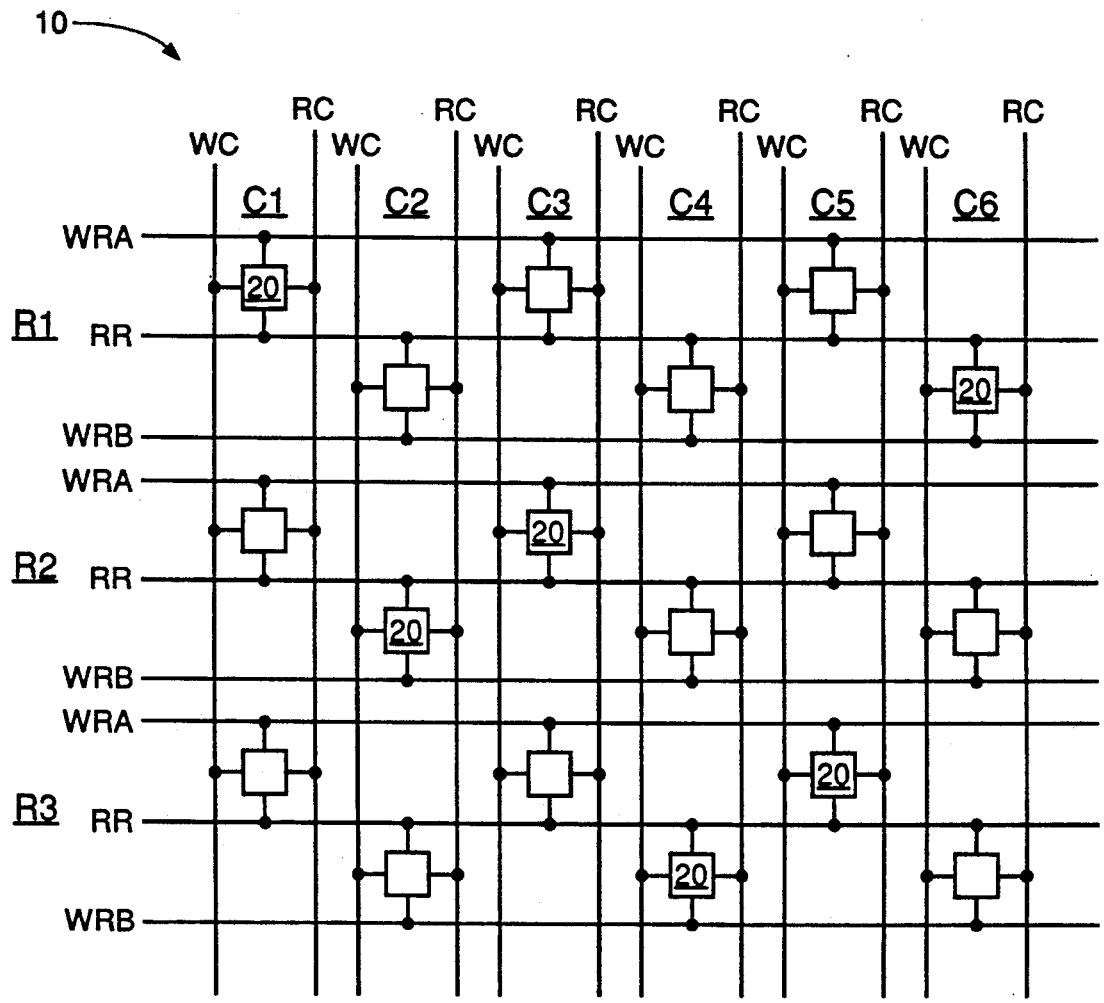
FIG. 2 is a block diagram of a memory array configuration of the present invention.

Referring now to FIG. 2, a memory array 10 configuration of memory cells 20 that allows simultaneous read and refresh of the memory cells includes M rows R1-RM (only the first three rows are depicted) and N columns of memory cells C1-CN (only the first six columns are depicted). The numbers M and N are integers greater than 1, according to the size of the memory array 10 required. For example, in the 4 megabit DRAM of FIG. 1, M and N are both equal to 1024. As in most dual-port memory cell arrays, the array contains a write column line, designated WC, corresponding to each column and a read column line, designated RC, corresponding to each column. Similarly, the array contains a read row line, designated RR, corresponding to each row. However, unlike most dual-port memory cell arrays, each row contains two write row lines, designated WRA and WRB, corresponding to each row.

Each row R1-RM is arranged into a top half-row of N/2 memory cells corresponding to each odd-numbered column C1, C3, . . . CN-1, and a bottom half-row of N/2 memory cells corresponding to each even-numbered column C2, C4, . . . CN in a folded architecture. In the present invention, it is desirable that each of the memory cells 20 comprises a non-destructive read two-port type memory cell. Each memory cell in the top half-row has a write column node coupled to the respective write column line WC, a read column node coupled to the respective read column line RC, a write row node coupled to the respective first write row line WRA, and a read row node coupled to the respective read row line RR. Each memory cell in the bottom half-row has a write column node coupled to the respective write column line WC, a read column node coupled to the respective read column line RC, a write row node coupled to the respective second write row line WRB, and a read row node coupled to the respective read row line RR.

Figure 3:
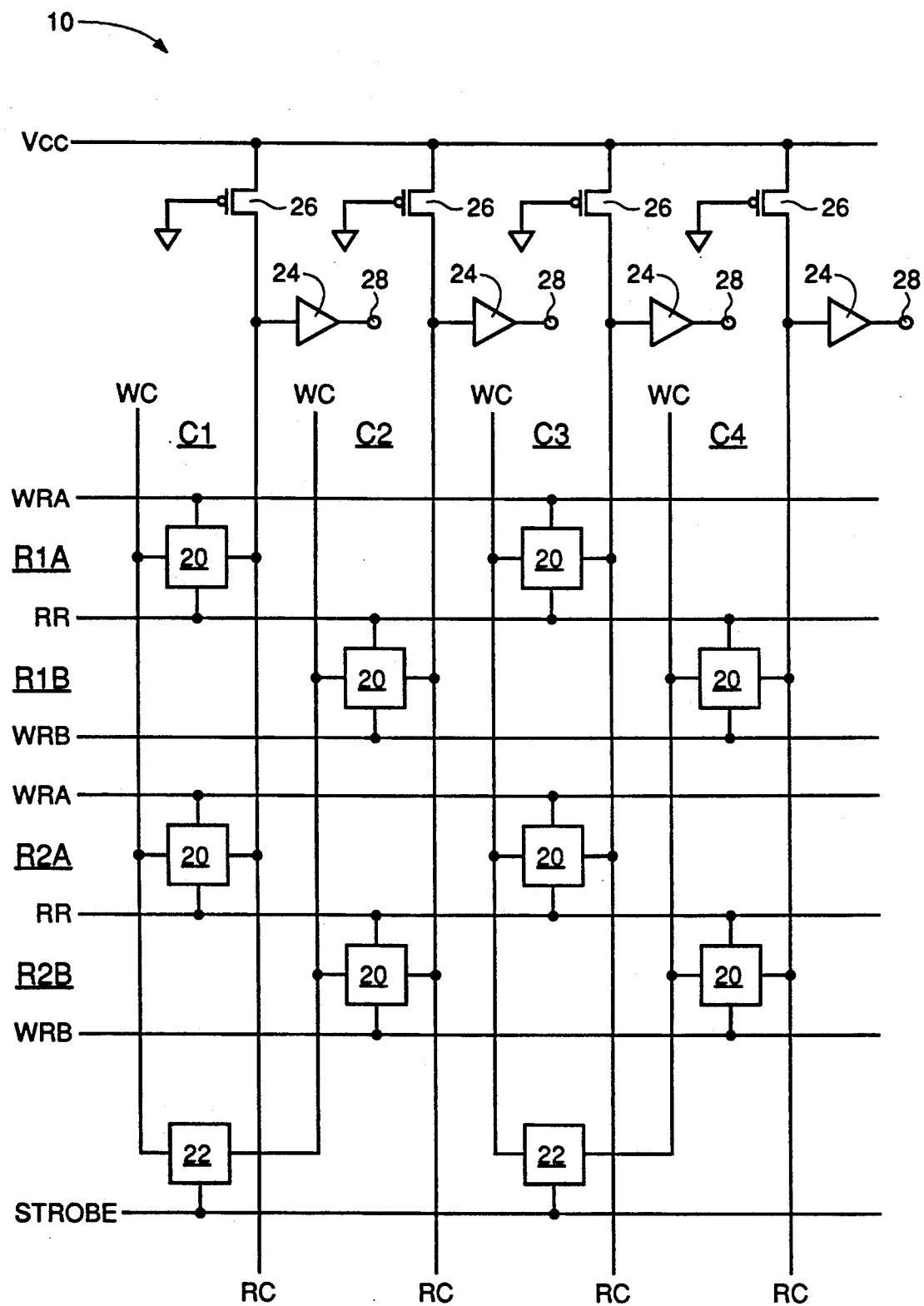
FIG. 3 is a more detailed block/schematic diagram of the memory array of FIG. 2.

Referring now to FIG. 3, the first four columns C1-C4 of the array 10 are depicted and the first two rows of the array are depicted. Each half-row is labeled. For example, the first row is labeled R1A and R1B designating the top and bottom half-rows. A row of N/2 charge sensing amplifiers 22 has a first input coupled to an odd-numbered write column line and a second input coupled to a next even-numbered write column. A row of N current/voltage sensing amplifiers 24 in circuit block 50 has an input coupled to one of the read column lines and an output 28 for transforming the charge on the read column line into a valid digital signal. The row of N current/voltage sensing amplifiers 24 sense the voltage drop across (or the current flow through) a row of N P-channel pull-up transistors 26.

Figure 4:
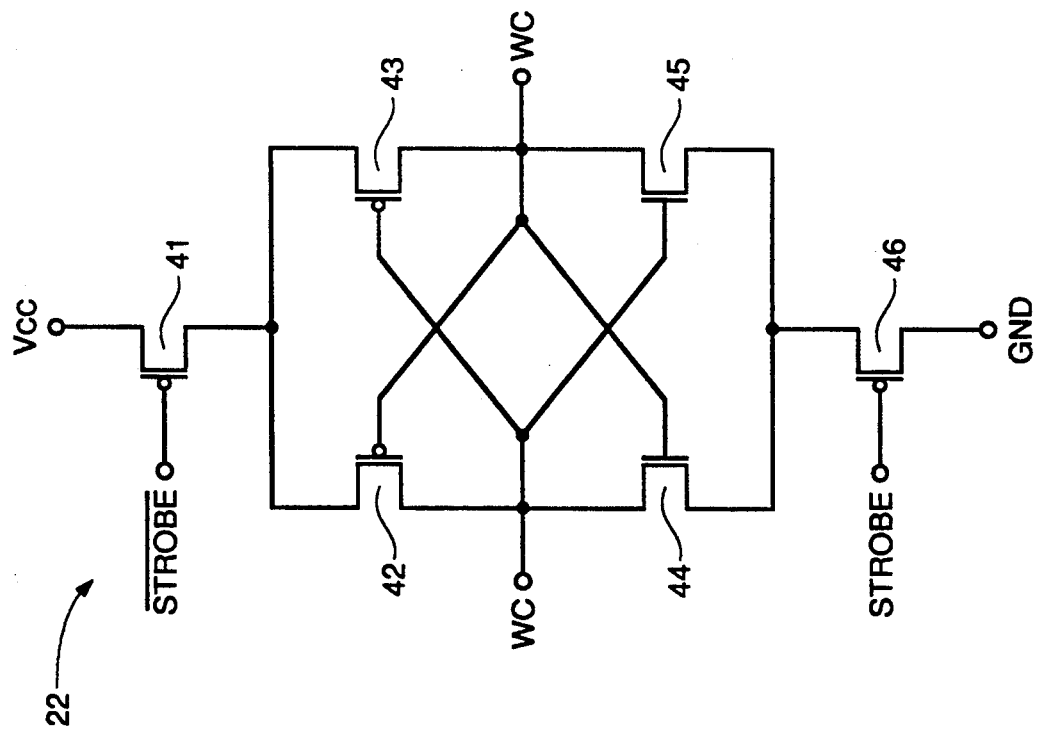
FIG. 4 is a schematic diagram of a prior art charge sensing amplifier suitable for use in the present invention.

Referring now to FIG. 4, a charge sensing amplifier 22 suitable for use in the present invention includes a differential strobe input for selectively enabling and disabling charge amplification. Taking the STROBE signal to a logic one enables the amplification of the charge sensing amplifier 22. Amplifier 22 includes first and second P-channel transistors 42 and 43. The sources of transistors 42 and 43 are coupled together and to the positive supply voltage, VCC, typically equal to five volts, through the P-channel strobe transistor 41. The P-channel strobe transistor 41 is energized with an inverted STROBE signal. Amplifier 22 further includes third and fourth N-channel transistors 44 and 45. The sources of transistors 44 and 45 are coupled together and to a negative supply voltage or ground (GND), through the N-channel strobe transistor 46. The N-channel strobe transistor 46 is energized with a non-inverted STROBE signal. The drains of the first and third transistors 42 and 44 and the gates of the second and fourth transistors 43 and 45 are coupled together to form the first input, WC1. The drains of the second and fourth transistors 43 and 45 and the gates of the first and third transistors 42 and 44 are coupled together to form the second input, WC2.

In operation, small changes in charge on the word column lines establish a small positive or negative voltage differential across the inputs to the charge sensing amplifier 22. The small change is amplified by the positive feedback configuration of the amplifier, which ultimately establishes a full, valid logic level at the inputs. A logic one appears at the input that was originally slightly more positive than the other input, and, conversely, a logic zero appears at the input that was originally slightly more negative than the other input.

Figure 5:
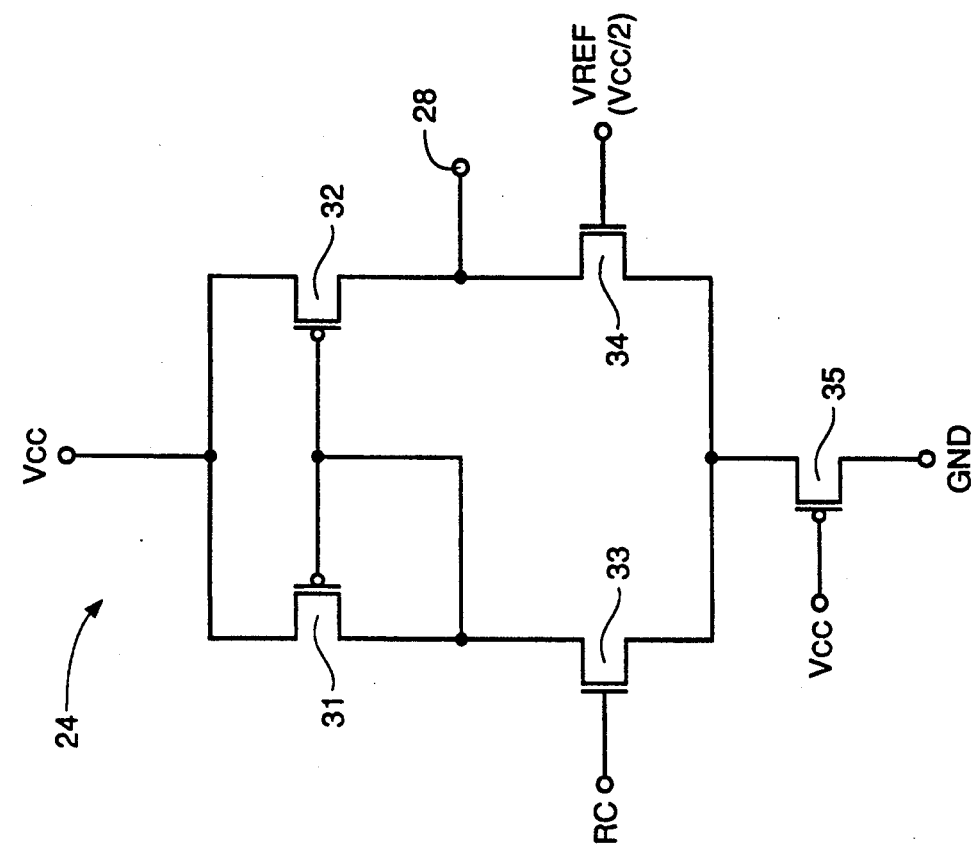
FIG. 5 is a schematic diagram of a prior art current-/voltage sensing amplifier suitable for use in the present invention.

Referring now to FIG. 5, a current/voltage sensing amplifier 24 suitable for use in the present invention includes a differential load formed by P-channel transistors 31 and 32. The gate and drain of transistor 31 are coupled together to form a first node and the drain of transistor 32 forms a second nodes. First and second N-channel transistors 33 and 34 form a differential voltage amplifier wherein the sources are coupled together and receive a bias current provided by N-channel transistor 35. The drains of the first and second transistors 33 and 34 are respectively coupled to the first and second nodes of the differential load 31, 32 to provide gain for the amplifier 24. The gate of the first transistor 33 forms the input, RC, the drain of the second transistor 34 forms the output 28, and the gate of the second transistor 34 is coupled to a reference voltage source, VREF, which can be between VCC-VT and VCC/2. The gates of transistors 33 and 34 are interchangeable, but the polarity of the output 28 is then inverted.

Referring back to FIG. 3, a read operation is conventionally performed by read-selecting an entire row and reading data out at the output 28 of the voltage sensing amplifiers 24. Read-selection of one of the entire row of memory cells is typically accomplished by coupling the read row line RR of the entire row to a logic low to couple charge from the memory cell 20 to the respective read column line RC. The respective write row lines WRA or WRB are coupled to a logic low to prevent new data from being read into the memory cells and corrupting the data during the read operation. The polarity of the read and write row lines is typically taken low for enabling the reading of data and preventing the writing of data. However, these polarities may be different in some types of dual-port memory cells.

Simultaneously, during the reading operation of the first half-row of memory cells, another half-row is write-selected in order to refresh the data in the memory cells. During a read operation, each of the write column lines is normalized to a reference level, usually VCC/2, or 2.5 volts. A second half-row of memory cells is write-selected in order to share stored charge in the memory cell with a corresponding write column line. Write-selection of one of the half-rows of memory cells is typically accomplished by coupling the write row line WRA or WRB to a logic high. Thus, a small incremental voltage is produced on a pair of write column lines. One of the pair of write column lines remains at the reference level, while the other of the pair is slightly more negative or positive depending upon the polarity of the data in the memory cell 20. The charge sensing amplifiers 22 coupled between the pair of write column lines force complementary valid logic levels on successive pairs of write column lines responsive to the charge difference in the write column lines. The charge sensing amplifiers are enabled through the STROBE signal during the simultaneous read and refresh operation. Once a valid logic level is established, this level restores the data in the memory cell through the write column node of the memory cell 20.

Although the present invention allows the user to read an entire row while selecting another half-row to refresh, it is apparent that the same row can be read and refreshed. As before, each of the write column lines are normalized to the reference level during the read operation. However, the current half-row of memory cells cannot be refreshed until the current/voltage sense amplifiers 24 settle. Therefore, the refresh cycle is delayed for a time to permit the current/voltage sense amplifiers to settle. After the current/voltage sensing amplifiers 24 have settled, the same half-row of memory cells is write-selected to share stored charge with the write column line. The charge sensing amplifiers 22 are enabled which forces complementary valid logic levels on the successive pairs of write column lines responsive to the charge difference in the write column lines. The same half-row is therefore refreshed after completing a read operation.

Having described and illustrated the principles of the invention in a preferred embodiment thereof, it is apparent to those skilled in the art that the invention can be modified in arrangement and detail without departing from such principles. For example, many other memory array architectures such as folded, non-folded, and segmented architectures can be adapted to contain the simultaneous refresh feature of the present invention. I therefore claim all modifications and variations coming within the spirit and scope of the following claims.

I claim:

1. A memory array configuration of memory cells that allows simultaneous read and refresh of the memory cells comprising:

two or more rows and two or more columns of memory cells;

a write column line corresponding to each column of memory cells;

a read column line corresponding to each column of memory cells;

first and second write row lines corresponding to each row of memory cells;

a read row line corresponding to each row of memory cells;

each memory cell in the array being coupled to the respective write column line, read column line, and read a row line;

each row of memory cells being arranged into a top half-row of memory cells corresponding to each odd-numbered column of memory cells, and a bottom half-row of memory cells corresponding to each even-numbered column of memory cells;

each memory cell in the top half-row being coupled to the respective first write row line;

each memory cell in the bottom half-row being coupled to the respective second write row line;

charge sensing means coupled to each successive pair of write column lines; and current/voltage sensing means coupled to each read column line.

2. A memory array configuration of memory cells that allows simultaneous read and refresh of the memory cells comprising:

M rows and N columns of memory cells, wherein M and N are integers greater than 1;

a write column line corresponding to each column;

a read column line corresponding to each column;

first and second write row lines corresponding to each row;

a read row line corresponding to each row;

each row being arranged into a top half-row of N/2 memory cells corresponding to each odd-numbered column and a bottom half-row of N/2 memory cells corresponding to each even-numbered column;

each memory cell in the top half-row having a write column node coupled to the respective write column line, a read column node coupled to the respective read column line, a write row node coupled to the respective first write row line, and a read row node coupled to the respective read row line;

each memory cell in the bottom half-row having a write column node coupled to the respective write column line, a read column node coupled to the respective read column line, a write row node coupled to the respective second write row line, and a read row node coupled to the respective read row line;

a row of N/2 charge sensing amplifiers having a first input coupled to an odd-numbered write column line and a second input coupled to a next even-numbered write column; and a row of N current/voltage sensing amplifiers having an input coupled to one of the read column lines and an output for providing a digital signal.

3. A memory array configuration as in claim 2 in which each of the memory cells comprises a nondestructive read memory cell.

4. A memory array configuration as in claim 2 in which at least one of the charge sensing amplifier comprises means coupled to a strobe input for selectively enabling and disabling the amplification of the charge sensing amplifier.

5. A memory array configuration as in claim 2 in which at least one of the charge sensing amplifiers comprises:

first and second transistors of a first type each having a source, a drain, and a gate, the sources being coupled together and to a first source of supply voltage; and third and fourth transistors of a second type each having a source, a drain, and a gate, the sources being coupled together and to a second source of supply voltage, wherein the drains of the first and third transistors and the gates of the second and fourth transistors are coupled together to form the first input, and the drains of the second and fourth transistors and the gates of the first and third transistors are coupled together to form the second input.

6. A memory array configuration as in claim 5 comprising:
   means for selectively coupling the coupled sources of the first and second transistors to the first source of supply voltage responsive to an inverted strobe signal; and
   means for selectively coupling the coupled sources of the third and fourth transistors to the second source of supply voltage responsive to a strobe signal.

7. A memory array configuration as in claim 2 in which at least one of the current/voltage amplifiers comprises:
   a differential load having first and second nodes; and
   first and second transistors each having a source, a drain, and a gate, the sources being coupled together and to a source of bias current,
   wherein the drains of the first and second transistors are respectively coupled to the first and second nodes of the differential load, and
   the gate of the first transistor forms the input, the drain of the second transistor forms the output, and the gate of the second transistor is coupled to a reference voltage source.

8. In a memory array including two or more rows and two or more columns of memory cells, a write column line corresponding to each column, a read column line corresponding to each column, and a read row line corresponding to each row, wherein each memory cell in the array is coupled to the respective write column line, read column line, and read row line, a method for allowing simultaneous read and refresh of different rows in the array, the method comprising the steps of:
   providing first and second write row lines;
   arranging each row into a top half-row of memory cells corresponding to each odd-numbered column and a bottom half-row of memory cells corresponding to each even-numbered column;
   coupling each memory cell in the top half-row to the respective first write row line;
   coupling each memory cell in the bottom half-row to the respective second write row line;
   charge sensing each successive pair of write column lines; and
   current/voltage sensing each read column line;
   read-selecting an entire row of memory cells;
   reading data out of the memory cells in the read-selected row;
   normalizing each of the write column lines to a reference level;
   write-selecting, simultaneously with the step of read-selecting, another of the half-rows of memory cells from a row different than the read-selected row in order to refresh the write-selected half-row; and
   forcing complementary valid logic on successive pairs of write column lines responsive to the charge difference in the write column lines.

9. In a memory array having M rows and N columns of memory cells, wherein M and N are integers greater than 1, a write column line corresponding to each column, a read column line corresponding to each column, a write row line corresponding to each row, a read row line corresponding to each row, a method for allowing simultaneous read and refresh of the memory cells, the method comprising;
   providing a second write row line for each row of memory cells;
   arranging each row into a top half-row of N/2 memory cells corresponding to each odd-numbered column and a bottom half-row of N/2 memory cells corresponding to each even-numbered column;
   coupling a write row node of each memory cell in the top half-row to a respective first write row line;
   coupling a write row node of each memory cell in the bottom half-row to the respective second write row line;
   coupling a write column line, a read column line, and a read row line of each memory cell in each row to the respective column and row line;
   providing a row of N/2 charge sensing amplifiers having first and second inputs;
   coupling the first input of each of the charge sensing amplifiers to an odd-numbered write column line and the second input of each of the charge sensing amplifiers coupled to a next even-numbered write column;
   providing a row of N current/voltage sensing amplifiers having an input and an output;
   coupling the input of each of the current/voltage sensing amplifiers to one of the read column lines;
   providing a digital signal at the output of each of the current/voltage sensing amplifiers;
   read-selecting one of the entire rows of memory cells;
   reading data out at the output of the current/voltage sensing amplifiers respectively coupled to a read column node of each of the memory cells;
   normalizing each of the write column lines to a reference level;
   write-selecting, simultaneously with the step of read-selecting, another of the half-rows of memory cells from a row different than the read-selected row to share stored charge in the memory cell with a corresponding write column line to refresh the write-selected half-row; and
   forcing complementary valid levels on successive pairs of write column lines responsive to the charge difference in the write column lines.

10. A method for allowing simultaneous reading and refresh of memory cells in a memory array as in claim 9 in which the step of read-selecting one of the half-rows of memory cells comprises the steps of:
   coupling the read row line to a logic low; and
   simultaneously maintaining the write row line at a logic low.

11. A method for allowing simultaneous reading and refresh of memory cells in a memory array as in claim 9 in which the step of write-selecting another of the half-rows of memory cells comprises the step of coupling the write row line to a logic high.

12. A method for allowing simultaneous reading and refresh of memory cells in a memory as in claim 9 in which the step of forcing complementary valid logic levels on successive pairs of write column lines comprises the step of enabling amplification in the charge sensing amplifiers with a strobe signal.

* * * * *